(12) United States Patent
Nakazawa et al.

(10) Patent No.: US 8,391,325 B2
(45) Date of Patent: Mar. 5, 2013

(54) OPTICAL DEVICE AND METHOD FOR FABRICATING OPTICAL DEVICE

(75) Inventors: Keiji Nakazawa, Kanagawa (JP); Haruo Yonetani, Kanagawa (JP)

(73) Assignee: Sumitomo Electric Device Innovations, Inc., Yokohama-shi, Kanagawa (JP)

(*) Notice: Subject to any disclaimer, the term of this patent is extended or adjusted under 35 U.S.C. 154(b) by 0 days.

(21) Appl. No.: 13/192,752

(22) Filed: Jul. 28, 2011

(65) Prior Publication Data
US 2012/0027036 A1   Feb. 2, 2012

(30) Foreign Application Priority Data

Jul. 28, 2010   (JP) .................................. 2010-169867

(51) Int. Cl.
*H01S 3/13*   (2006.01)

(52) U.S. Cl. .................. 372/29.02; 372/29.022; 372/36; 372/34

(58) Field of Classification Search ............... 372/29.02, 372/29.022, 36, 34
See application file for complete search history.

(56) References Cited

U.S. PATENT DOCUMENTS

| | | | |
|---|---|---|---|
| 2005/0063649 A1* | 3/2005 | Fukuda et al. | 385/92 |
| 2007/0077013 A1 | 4/2007 | Nakagawa et al. | |
| 2008/0187268 A1* | 8/2008 | Kaneko et al. | 385/27 |

FOREIGN PATENT DOCUMENTS

JP   2007-101700 A   4/2007

* cited by examiner

*Primary Examiner* — Kinam Park
(74) *Attorney, Agent, or Firm* — Westerman, Hattori, Daniels & Adrian, LLP

(57) ABSTRACT

An optical device including: a carrier having a first area and a second area, both edges of the second area having a wall of a step, one edge of the second area being adjacent to the first area, the first area having a first thickness, the second area having a second thickness larger than the first thickness; and a first optical component mounted on the first area of the carrier, the second area of the carrier being an absence area of a component.

11 Claims, 8 Drawing Sheets

EMBODIMENT

COMPARATIVE EXAMPLE

EMBODIMENT

OPTICAL DEVICE AND METHOD FOR FABRICATING OPTICAL DEVICE

CROSS-REFERENCE TO RELATED APPLICATION

This application is based upon and claims the benefit of priority of the prior Japanese Patent Application No. 2010-169867, filed on Jul. 28, 2010, the entire contents of which are incorporated herein by reference.

BACKGROUND (i) Technical Field

The present invention relates to an optical device and a method of fabricating an optical device.

(ii) Related Art

There is a demand for improving reliability of an optical device. The optical device controls temperature of each optical component with a temperature control device. Thus, optical characteristics of the optical component are stabilized. Japanese Patent Application Publication No. 2007-101700 discloses an optical device having a temperature control device.

SUMMARY

The temperature control device has a structure in which a plurality of peltier elements are sandwiched between an upper plate and a lower plate. Therefore, mechanical strength of the temperature control device is relatively low. It is necessary to reduce distortion of the temperature control device in order to secure the reliability of the optical device.

It is an object of the present invention to provide an optical device having high reliability and a method for fabricating the optical device.

According to an aspect of the present invention, there is provided an optical device including: a carrier having a first area and a second area, both edges of the second area having a wall of a step, one edge of the second area being adjacent to the first area, the first area having a first thickness, the second area having a second thickness larger than the first thickness; and a first optical component mounted on the first area of the carrier, the second area of the carrier being an absence area of a component.

According to another aspect of the present invention, there is provided a method for fabricating an optical device including: a first step of preparing a carrier having a first area and a second area, both edges of the second area having a wall of a step, one edge of the second area being adjacent to the first area, the first area having a first thickness, the second area having a second thickness larger than the first thickness; a second step of mounting the carrier on a temperature control device after the first step; and a third step of mounting a first optical component on the first area of the carrier after the second step.

DETAILED DESCRIPTION

A description will be given of a comparative example.

COMPARATIVE EXAMPLE

Figure 1:
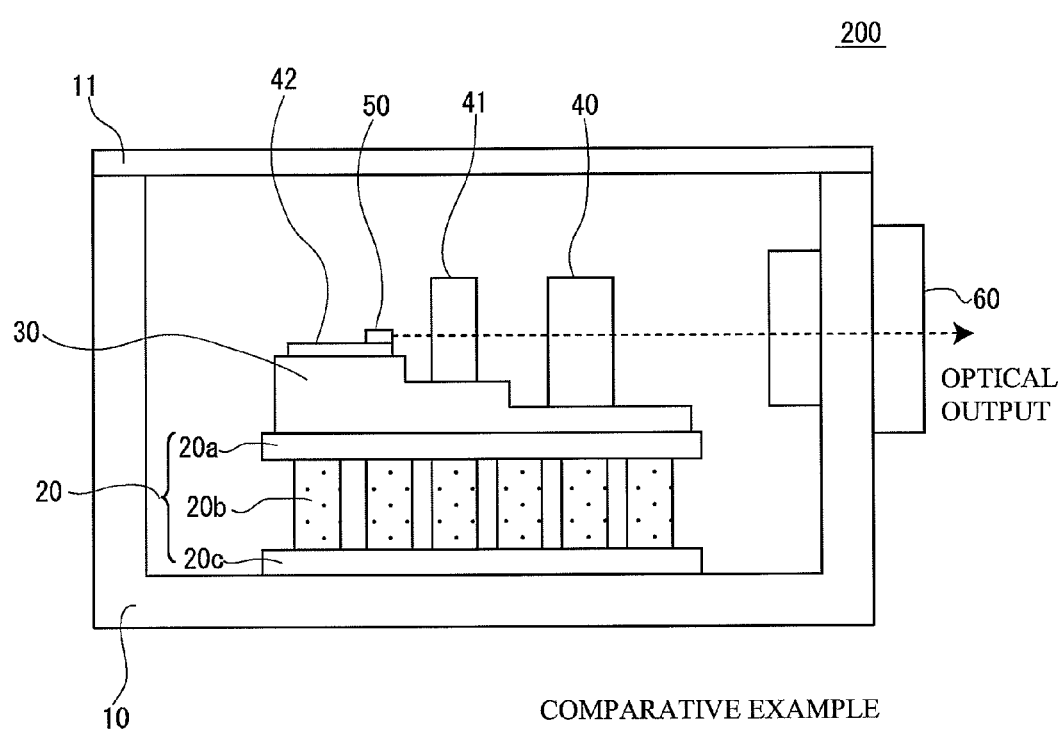
FIG. 1 illustrates an optical device in accordance with a comparative example.

FIG. 1 illustrates an optical device 200 that is an example of an optical device in accordance with a comparative example. The optical device 200 has a temperature control device 20, a carrier 30, an optical isolator 40, a lens 41, a sub-carrier 42, and a semiconductor laser 50 in a space closed by a package 10 and a cap 11. In FIG. 1, the temperature control device 20, the carrier 30, the optical isolator 40, the lens 41, the sub-carrier 42 and the semiconductor laser 50 are viewed by seeing through the package 10.

The temperature control device 20 has a structure in which a plurality of peltier elements 20b are sandwiched between an upper plate 20a and a lower plate 20c. The carrier 30 is provided on the temperature control device 20. The optical isolator 40, the lens 41 and the sub-carrier 42 are provided on the carrier 30. The semiconductor laser 50 is provided on the sub-carrier 42. The semiconductor laser 50, the lens 41 and the optical isolator 40 are arranged in this order so that an output light of the semiconductor laser 50 passes through the optical components in the order. A holder 60 having a transparent member such as glass is provided at a position of the package 10 where a light is output from the optical isolator 40.

As illustrated in FIG. 1, a thickness of an edge portion of the carrier 30 in a light-outputting direction is the same as that of an area of the carrier 30 where the optical isolator 40 is mounted. In this case, rigidity of the edge portion of the carrier 30 is relatively low. Therefore, the edge portion of the carrier 30 tends to warp when the edge portion is subjected to stress. The warp of the carrier 30 may distort the temperature control device 20 largely.

[Embodiment]

Figure 2:
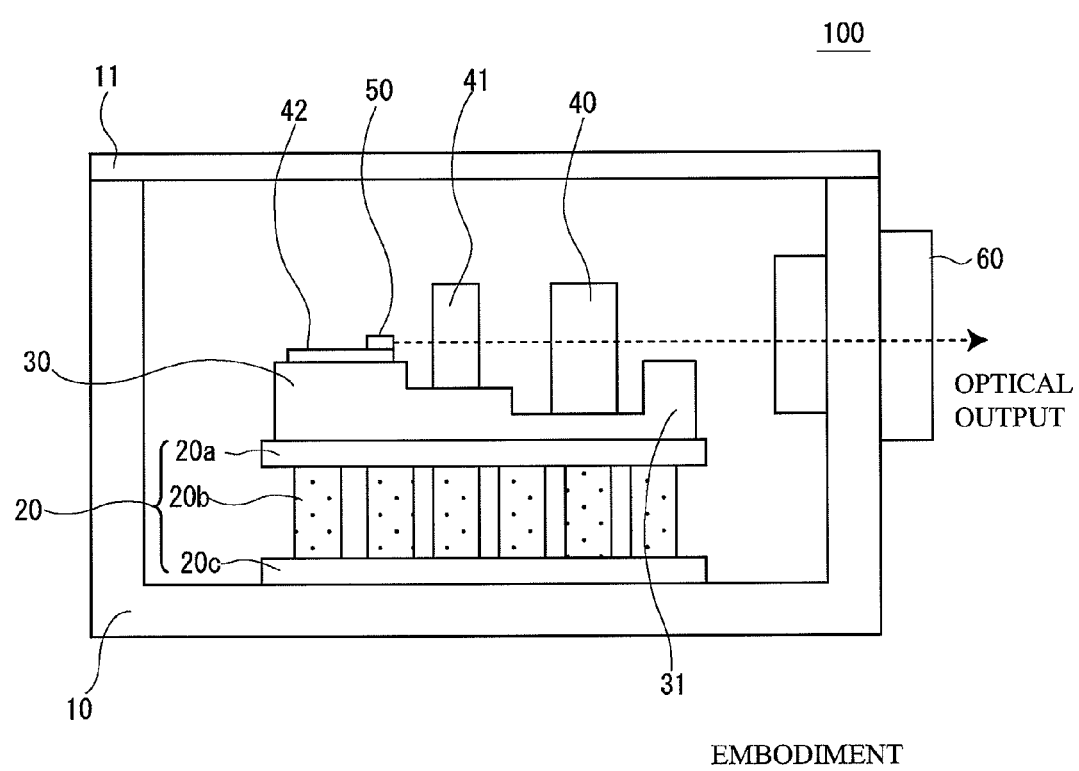
FIG. 2 illustrates an optical device in accordance with an embodiment.
Figure 3:
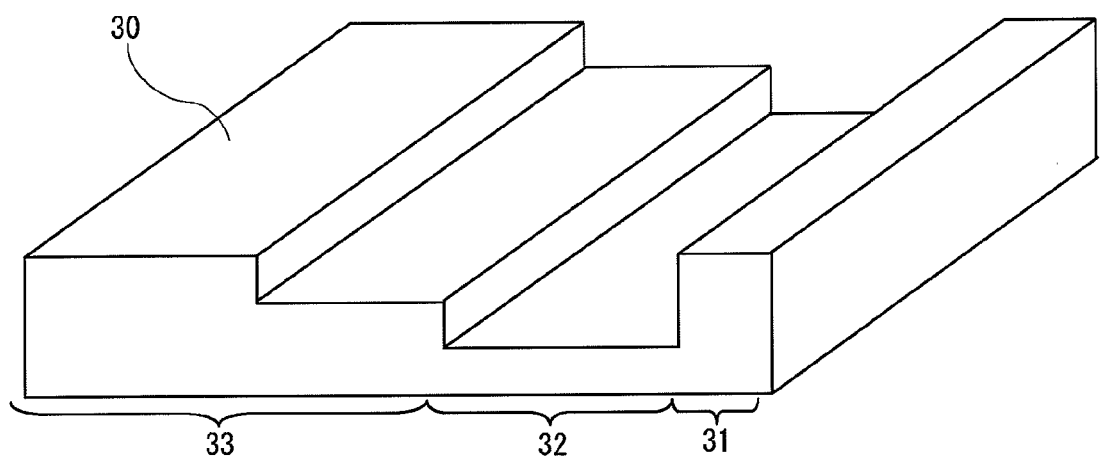
FIG. 3 illustrates a carrier in accordance with the embodiment.
Figure 4:
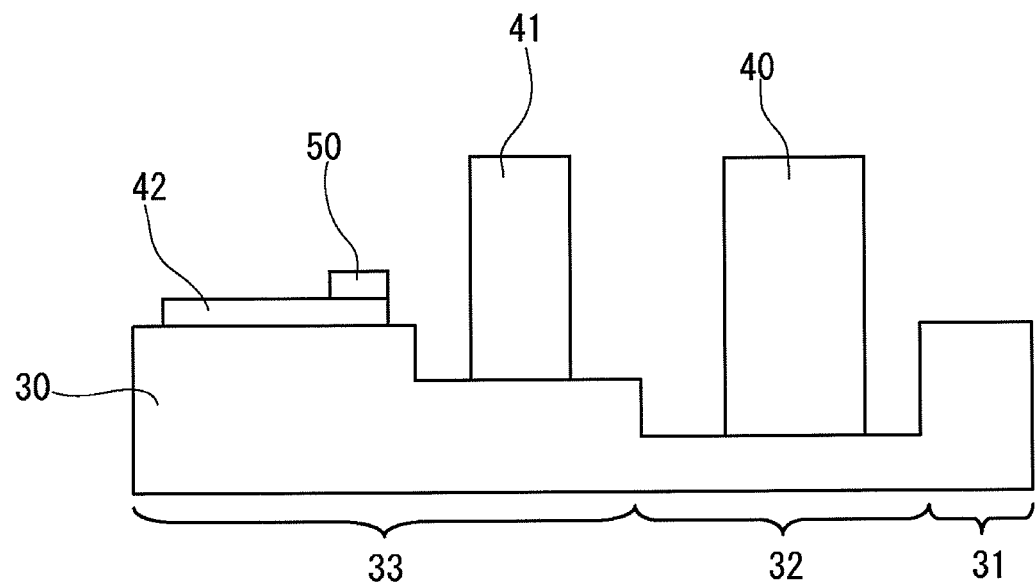
FIG. 4 illustrates a carrier in accordance with the embodiment.

Next, a description will be given of an embodiment of the present invention. FIG. 2 illustrates an optical device 100 in accordance with the embodiment. In FIG. 2, the same components have the same numeral as FIG. 1. In FIG. 2, the temperature control device 20, the carrier 30, the optical isolator 40, the lens 41, the sub-carrier 42 and the semiconductor laser 50 are viewed by seeing through the package 10. The optical device 100 is different from the optical device 200 in a point that the carrier 30 has a different shape. FIG. 3 and FIG. 4 illustrate an enlarged view of the carrier 30 of FIG. 2. FIG. 3 illustrates a perspective view of the carrier 30. FIG. 4 illustrates a side view of the carrier 30.

A main body of the carrier 30 is, for example, made of iron-nickel-cobalt alloy (KOVAR). The carrier 30 may act as a first area 32, a second area 31 and a third area 33. The first area 32 is an area where the optical isolator 40 is mounted as a first optical component. The second area 31 has a thickness larger than that of the first area 32. The second area 31 is positioned between the first area 32 and an edge of the carrier 30 in a light-outputting direction. Both edges of the second area 31 have a wall of a step. One edge of the second area 31 is adjacent to the first area 32. The second area 31 is no component area where no components are mounted. In other words, the second area 31 is an absence area of a component. The third area 33 is an area where the lens 41 and the semiconductor laser 50 mounted on the sub-carrier 42 are mounted as a second optical component.

In the optical device 100, the carrier 30 has the first area 32 having a first thickness and acting as component area where a component is mounted and the second area 31 having a second thickness larger than the first thickness and acting as no component area where no components are mounted.

The thickness of the carrier 30 is determined in view of corresponding a height direction of an optical component mounted thereon to a target. Therefore, freedom degree of designing of the thickness of the first area 32 is low, and the thickness of the first area 32 tends to be designed to be small. In contrast, in the embodiment, the rigidity of the edge portion of the carrier 30 is secured, because the second area 31 having the thickness larger than that of the first area 32 is provided.

It is not necessary to adjust the height of the second area 31, because the second area 31 is the no-component area where no components are mounted. Normally, the thickness of the second area 31 is the same as that of the first area 32 as illustrated in FIG. 1. In accordance with the embodiment, the rigidity of the second area 31 acting as the edge portion of the carrier 30 is improved. Therefore, the warp of the carrier 30 is suppressed. And, the distortion of the temperature control device 20 is suppressed. A relatively thicker portion of the third area 33 has a thickness of 1000 µm, for example. A relatively thinner portion of the third area 33 has a thickness of 800 µm, for example. The second area 31 has a thickness of 1000 µm, for example. The first area 32 has a thickness of 500 µm, for example.

Figure 5:
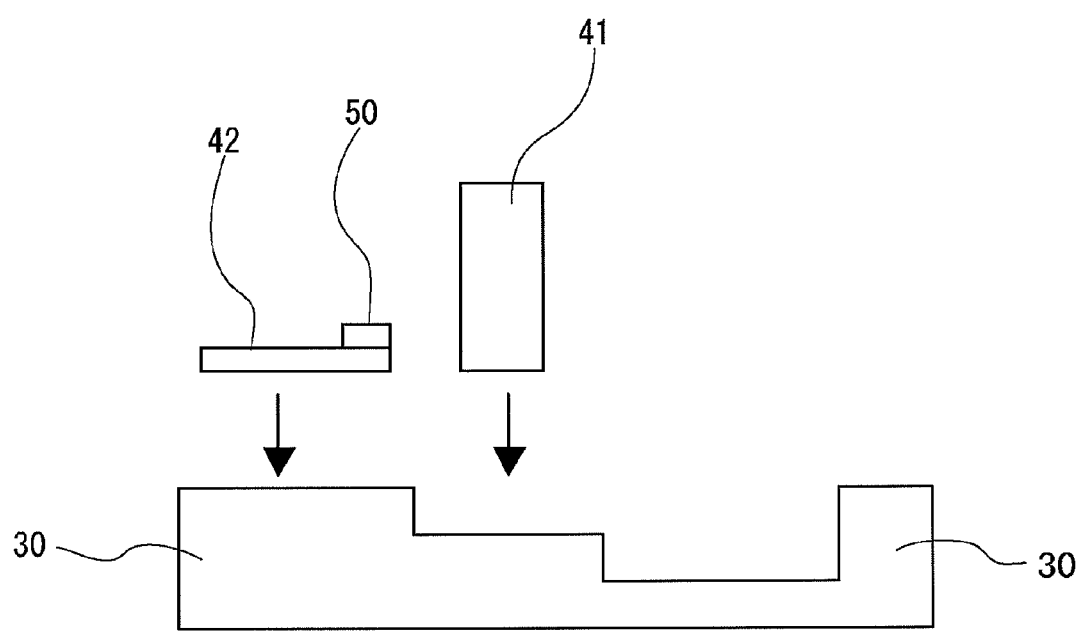
FIG. 5 illustrates a fabrication method in accordance with the embodiment.
Figure 7:
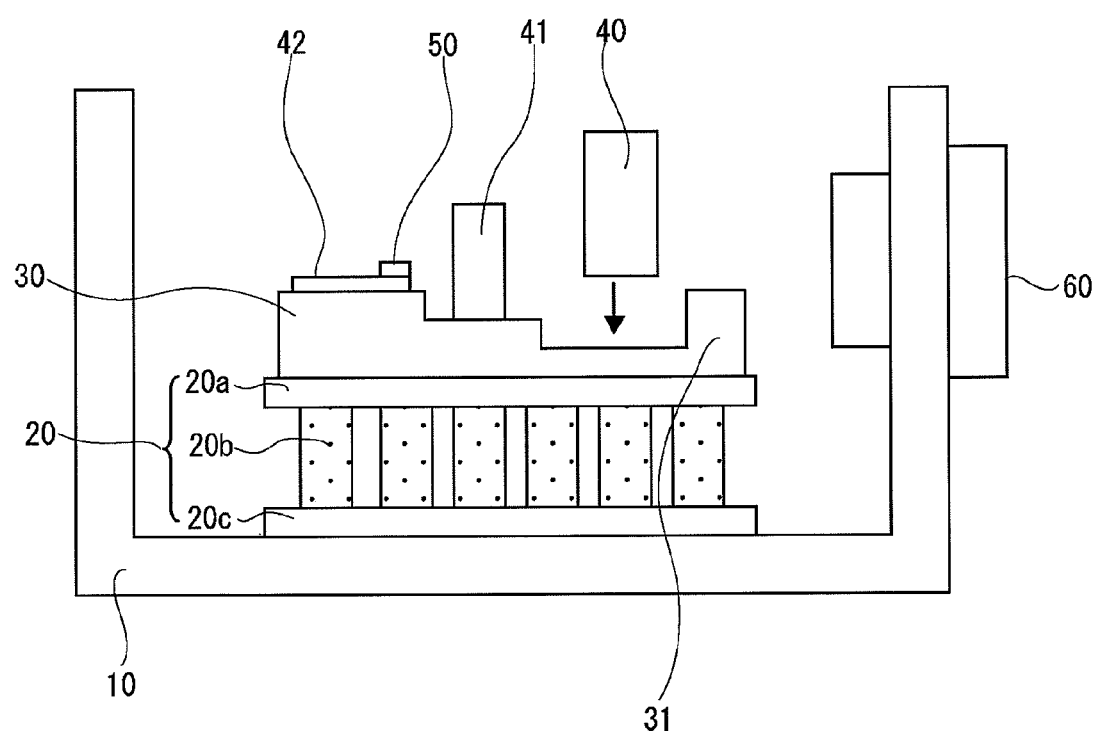
FIG. 7 illustrates a fabrication method in accordance with the embodiment.

A description will be given of a method for fabricating the optical device 100. FIG. 5 though FIG. 7 illustrate the method. The numerals are the same as FIG. 2 through FIG. 4.

As illustrated in FIG. 5, an optical component is mounted on the carrier 30. In concrete, the lens 41 and the sub-carrier 42 mounting the semiconductor laser 50 are mounted on the carrier 30. A laser welding using YAG laser or the like or a soldering is used in the mounting process. In this stage, the optical isolator 40 is not mounted yet in order to suppress damage of the optical isolator 40 caused by the heat generated in the mounting process of the carrier 30 on the temperature control device 20.

Figure 6:
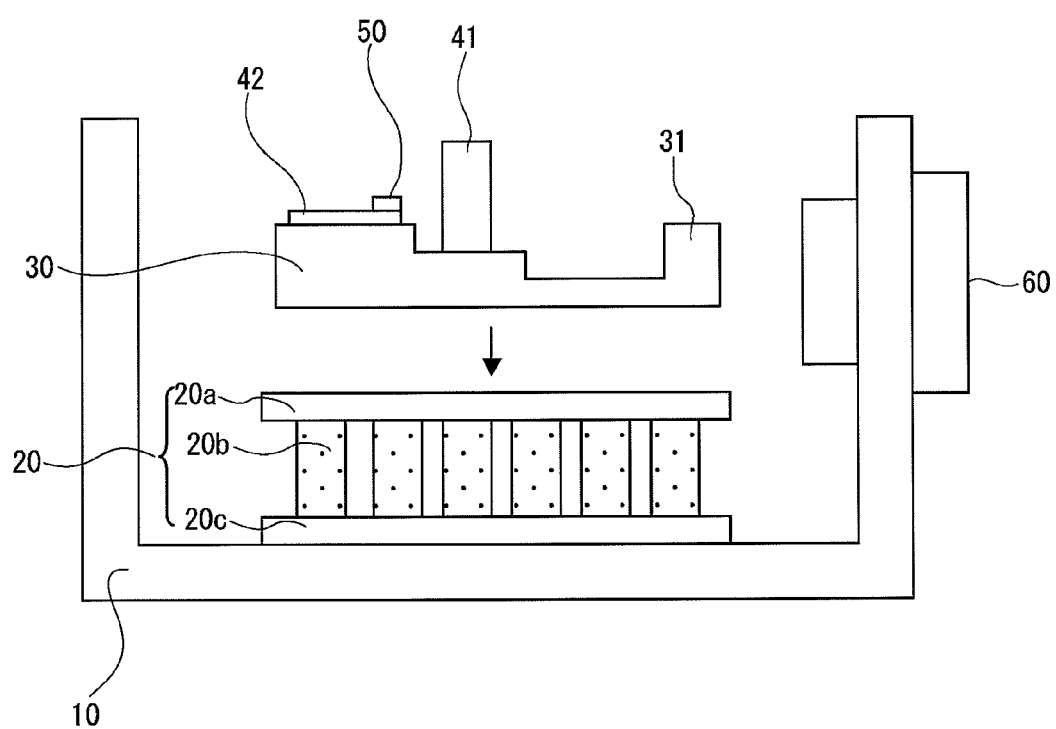
FIG. 6 illustrates a fabrication method in accordance with the embodiment.

As illustrated in FIG. 6, the carrier 30 is mounted after the temperature control device 20 is mounted in the package 10. A soldering is adopted in order to improve thermal conductivity between the temperature control device 20 and the carrier 30. A solder such as SnAgCu-based material may be used for the soldering. A treatment temperature of the soldering is higher than a melting point of the solder, and is approximately 230 degrees C., for example. In the stage, the optical isolator 40 is not mounted on the carrier 30. Therefore, the damage of the optical isolator 40 that is weak against heat is suppressed.

Next, as illustrated in FIG. 7, the optical isolator 40 is mounted on the carrier 30. The optical isolator 40 is mounted through a laser welding process with use of a YAG laser. In the laser welding, a laser is irradiated at an interface between the carrier 30 and the optical isolator 40. The temperature of the interface is increased only locally in the laser welding. Therefore, thermal damage of the optical isolator 40 is suppressed. However, the carrier 30 may be subjected to stress when the laser welding is performed.

The carrier 30 having the structure in accordance with the comparative example may warp because of the stress.

The warp of the carrier 30 may cause warp of the upper plate 20a of the temperature control device 20, because the carrier 30 and the temperature control device 20 are soldered with each other. This may cause large stress in the temperature control device 20. In this case, the reliability of the temperature control device may be degraded. In a worst-case situation, the peltier element structuring the temperature control device 20 may be peeled and broken.

On the other hand, in the embodiment, the carrier 30 has the second area 31 having large thickness. Therefore, the rigidity of the edge portion of the carrier 30 is improved. This may suppress the warp of the carrier 30. Thereby, degradation of the reliability or the breaking of the temperature control device 20 may be suppressed. After the processes, the optical device 100 is fabricated by sealing the package 10 with the cap 11.

In a case where the laser of the laser welding is irradiated to both edges of the optical isolator 40 facing with each other, the stress is the largest in a direction connecting the both edges during the laser welding of the optical isolator 40. On the other hand, the second area 31 has large rigidity in a longitudinal direction thereof. It is therefore possible to use the rigidity of the second area 31 effectively, if the laser is irradiated to both edges of the optical isolator 40 in the longitudinal direction of the second area 31 during the laser welding of the optical isolator 40.

A difference of the warp of the carrier 30 was measured between the comparative example illustrated in FIG. 1 and the embodiment as illustrated in FIG. 2. A sample of the embodiment was fabricated in accordance with the above-mentioned fabrication processes. Another sample of the comparative example was fabricated in accordance with the above-mentioned fabrication processes, but the carrier 30 has the structure in accordance with the comparative example.

The thickness of the edge portion (the second area 31) of the carrier 30 of the embodiment was 1000 µm. The thickness of the area (the first area 32) where the optical isolator 40 is mounted was 500 µm. The thickness of the edge portion (including the component area of the optical isolator 40) of the carrier 30 of the comparative example was 500 µm. The carrier was made of the same iron-nickel-cobalt alloy (KOVAR) in the embodiment and the comparative example. The condition of the irradiation of the YAG laser was the electrical power: 6.0 J and the irradiation time: 2.0 ms.

As the result of the measurement, in the comparative example, large warp appeared in the carrier. Both edges of the edge portion of the carrier having a small thickness were lifted by 10 µm on an average, compared to the condition before the welding. In contrast, in the embodiment, both edges of the first area 32 were lifted by only 4 µm on an average, compared to the condition before the welding.

The thickness of the second area 31 of the carrier 30 may be determined in a range where the edge portion of the carrier 30 has necessary rigidity. Although the thickness of the second area 31 of the carrier 30 was twice as the first area 32 in the above-mentioned measurement, the thickness of the second area 31 may be 1.5 times to 3 times as the first area 32.

Figure 8:
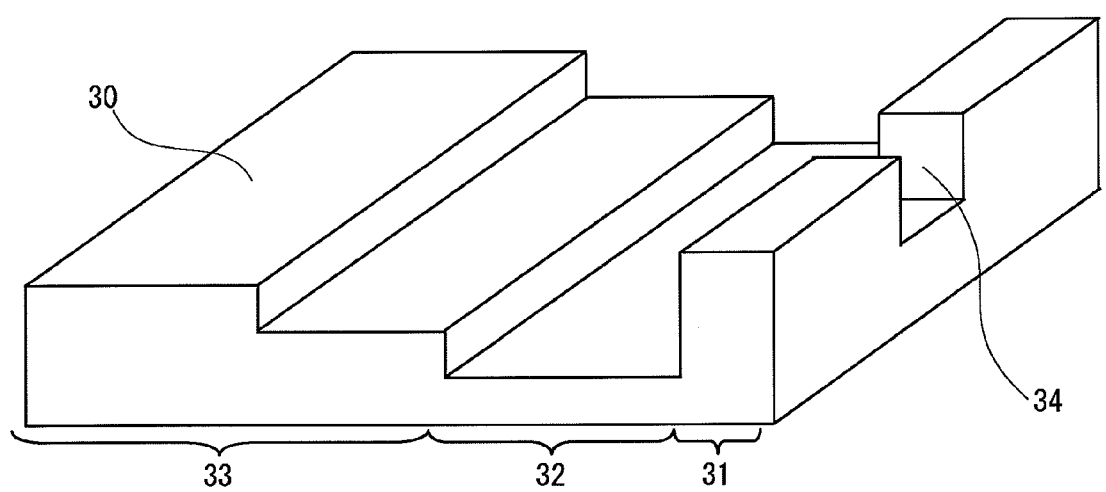
FIG. 8 illustrates another carrier.

In a case where the second area 31 interrupts the optical axis, the second area 31 may have a cut-out area. FIG. 8 illustrates another example of the carrier 30. The same components have the same numerals as FIG. 3. The carrier 30 of FIG. 8 has a structure in which the second area 31 is thicker than the third area 33. A relatively thicker portion of the third area 33 has a thickness of 1000 µm, for example. A relatively thinner portion of the third area 33 has a thickness of 800 µm, for example. The second area 31 has a thickness of 1500 µm, for example. The first area 32 has a thickness of 500 µm, for example. As illustrated in FIG. 8, the cut-out area 34 of the second area is acting as a channel to allow passage of the optical axis.

The optical component mounted on the first area 32 of the carrier 30 and the optical component mounted on the third area 33 of the carrier 30 may be a lens, an etalon, a diffractive grating, a light-receiving element or the like.

The third area 33 is thicker than the first area 32 in the embodiment. However, the thickness of the third area 33 may be determined according to an optical axis of an optical component to be mounted or another design necessity. For example, the thickness of the third area 33 may be equal to or less than that of the first area 32. However, the rigidity of an edge portion on the side of the third area 33 may be low, when the thickness of the third area 33 is equal to or less than that of the first area 32. In this case, an area thicker than the third area 33 may be provided as a no-component area, as well as the second area 31. Further, the third area 33 of the carrier 30 may not be provided, because the third area 33 is an area where the second optical component is to be mounted.

The present invention is not limited to the specifically disclosed embodiments and variations but may include other embodiments and variations without departing from the scope of the present invention.

What is claimed is:

1. An optical device comprising:
   a carrier having a first area and a second area, both edges of the second area having a wall of a step, one edge of the second area being adjacent to the first area, the first area having a first thickness, the second area having a second thickness larger than the first thickness; and
   a first optical component mounted on the first area of the carrier,
   the second area of the carrier being an absence area of a component.

2. The optical device as claimed in claim 1, further comprising a temperature control device on which the carrier is mounted.

3. The optical device as claimed in claim 1, further comprising a second optical component mounted on a third area of the carrier, the third area having a thickness larger than the first thickness.

4. The optical device as claimed in claim 1, wherein the first optical component is an optical isolator.

5. The optical device as claimed in claim 3, wherein the second optical component is a semiconductor laser.

6. The optical device as claimed in claim 2, wherein the temperature control device has a structure in which a plurality of peltier elements are sandwiched between an upper plate and a lower plate.

7. The optical device as claimed in claim 1, wherein an optical axis of the first optical component passes through a channel formed in the second area.

8. The optical device as claimed in claim 2, wherein:
   the carrier is mounted on the temperature control device by soldering; and
   the first optical component is mounted on the first area of the carrier by laser welding.

9. The optical device as claimed in claim 1, wherein the thickness of the second area is 1.5 times to 3 times as the thickness of the first area of the carrier.

10. The optical device as claimed in claim 1, wherein the thickness of the second area of the carrier is twice as the thickness of the first area of the carrier.

11. The optical device as claimed in claim 1, wherein the carrier is made of iron-nickel-cobalt alloy.

* * * * *